United States Patent
Yamaguchi

(10) Patent No.: US 9,013,248 B2
(45) Date of Patent: Apr. 21, 2015

(54) FILTER CIRCUIT

(75) Inventor: Kiyoshi Yamaguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 308 days.

(21) Appl. No.: 13/454,116

(22) Filed: Apr. 24, 2012

(65) Prior Publication Data

US 2012/0274420 A1    Nov. 1, 2012

(30) Foreign Application Priority Data

Apr. 26, 2011   (JP) ................. 2011-097962

(51) Int. Cl.
*H03H 7/01* (2006.01)
*H01P 1/203* (2006.01)
*H03H 1/00* (2006.01)

(52) U.S. Cl.
CPC ......... *H03H 7/0115* (2013.01); *H01P 1/20345* (2013.01); *H03H 2001/0085* (2013.01)

(58) Field of Classification Search
CPC .............. H03H 2001/0085; H03H 7/0015; H01P 1/20345
USPC .......................... 333/175, 185, 167; 336/200
See application file for complete search history.

(56) References Cited

U.S. PATENT DOCUMENTS

| | | | |
|---|---|---|---|
| 4,888,568 A | 12/1989 | Kawaguchi | |
| 6,476,689 B1 * | 11/2002 | Uchida et al. | 333/177 |
| 7,423,500 B2 | 9/2008 | Ishiwata | |
| 2002/0093397 A1 | 7/2002 | Nosaka | |
| 2006/0038635 A1 * | 2/2006 | Richiuso et al. | 333/177 |
| 2007/0103256 A1 | 5/2007 | Ishiwata | |

FOREIGN PATENT DOCUMENTS

| | | |
|---|---|---|
| CN | 101421918 A | 4/2009 |
| EP | 2 009 787 A1 | 12/2008 |
| JP | 2007-129565 A | 5/2007 |
| JP | 2007-274283 A | 10/2007 |
| TW | 200608427 A | 3/2006 |

OTHER PUBLICATIONS

Official Communication issued in corresponding Chinese Patent Application No. 201210124370.7, mailed on Aug. 15, 2014.

* cited by examiner

*Primary Examiner* — Benny Lee
*Assistant Examiner* — Rakesh Patel
(74) *Attorney, Agent, or Firm* — Keating & Bennett, LLP

(57) ABSTRACT

A bandpass filter includes a multilayer body, which includes a plurality of dielectric layers stacked on top of one another, a first inductor and a second inductor connected in series with each other, and a third inductor connected to a connection point between the first and second inductors, and a ground potential. The first inductor is defined by substantially open-loop-shaped first electrode patterns provided on the dielectric layers being superposed with one another in the stacking direction of the multilayer body. The second inductor and the third inductor are defined by second electrode patterns and third electrode patterns provided on the dielectric layers being superposed with one another in the stacking direction.

4 Claims, 5 Drawing Sheets

FILTER CIRCUIT

BACKGROUND OF THE INVENTION

1. Field of the Invention

The present invention relates to filter circuits that include inductors connected in a T-shaped pattern.

2. Description of the Related Art

In the related art, a variety of filter circuits that include inductors have been designed. FIG. 1 is a circuit diagram illustrating a filter circuit described in Japanese Unexamined Patent Application Publication No. 2007-129565. The filter circuit illustrated in FIG. 1 is a T-circuit low pass filter in which two inductors L11 and L12 are connected in series with each other and in which a point between these two inductors is connected to the ground via an inductor L13 and a capacitor C. The filter circuit illustrated in FIG. 1 includes inner layer electrode patterns of a multilayer body formed by stacking a plurality of dielectric layers on top of one another.

The filter circuit described in Japanese Unexamined Patent Application Publication No. 2007-129565 is configured such that the inductor L12 and the inductor L13 are provided on different layers with a ground electrode layer interposed therebetween in order to prevent the inductance of the inductor L13 from changing due to the inductor L12 and the inductor L13, which are disposed close to each other, becoming electromagnetically coupled with each other. Thus, the inductance of the inductor L13 is prevented from changing and it is possible to provide a low pass filter having desired frequency characteristics.

However, when a multilayer body is constructed by stacking dielectric layers on top of one another, since misalignment sometimes occurs between the dielectric layers, there is a risk of the inductances of the inductors L11, L12 and L13 described in Japanese Unexamined Patent Application Publication No. 2007-129565 being changed. For example, when the inductor L11 is provided in an upper layer portion of the multilayer body and the inductor L12 is provided in a lower layer portion of the multilayer body, if a misalignment occurs in the upper layer portion, just the inductance of the inductor L11 will change.

Consequently, there is a risk that the inductance ratio between the inductors L11, L12 and L13 will change and be significantly shifted from the inductance ratio for the desired filter characteristics. In addition, there is a risk that the mutual inductance will be changed by a deviation in the distance between the inductors L11, L12 and L13 and that this will affect the filter characteristics.

SUMMARY OF THE INVENTION

To overcome the problems described above, preferred embodiments of the present invention provide a filter circuit that, when a misalignment occurs between dielectric layers thereof, is capable of preventing or minimizing any effect of the misalignment on the filter characteristics.

A filter circuit according to a preferred embodiment of the present invention preferably includes a multilayer body including a plurality of dielectric layers that are stacked on top of one another, a first inductor in which a plurality of first conductive patterns provided on the plurality of dielectric layers are arranged so as to be superposed with one another in a stacking direction of the multilayer body, a second inductor in which second conductive patterns provided on the plurality of dielectric layers are arranged so as to be superposed with one another in the stacking direction of the multilayer body, and a third inductor in which third conductive patterns provided on the plurality of dielectric layers are arranged so as to be superposed with one another in the stacking direction of the multilayer body. The first inductor is connected in series with the second inductor and the third inductor is connected between a connection point between the first inductor and the second inductor, and a ground potential. The first conductive patterns, the second conductive patterns, and the third conductive patterns are respectively provided on the same plurality of dielectric layers.

In this configuration, the first, second, and third conductive patterns that respectively define the first inductor, the second inductor, and the third inductor, which are connected in a T-shaped pattern, are respectively provided on the same plurality of dielectric layers. Accordingly, when a misalignment occurs between the dielectric layers, the first, second, and third conductive patterns superposed with each other in the stacking direction are all similarly shifted. As a result, when a misalignment occurs between the dielectric layers, the inductances of the first inductor, the second inductor, and the third inductor are each changed by the same or substantially the same proportion.

For example, when the inductance of the first inductor is changed but the inductances of the second and third inductors are not changed, the characteristics of the filter including the inductors connected in a T-shaped pattern are greatly affected, whereas the effect on the filter characteristics can be prevented or minimized by using a configuration in which the inductances of the first inductor, the second inductor, and the third inductor are each changed by the same or substantially the same proportion, as in a preferred embodiment of the present invention.

In addition, as a result of providing the first inductor, the second inductor and the third inductor on the same dielectric layers, there is no deviation in the distance between the individual inductors, the mutual inductance does not change, and the effect on the circuit characteristics is prevented or minimized.

In the filter circuit according to a preferred embodiment of the present invention, the first conductive patterns and the second conductive patterns preferably have substantially the same shape and substantially the same pattern width, for example.

In this configuration, as a result of the first and second conductive patterns having substantially the same shape and pattern width, when a misalignment occurs, the amounts by which the first and second patterns are shifted are approximately the same, and as a result, it is ensured that the inductances of the first inductor and the second inductor are each changed by approximately the same proportion.

In the filter circuit according to a preferred embodiment of the present invention, the first inductor, the second inductor, and the third inductor are preferably arranged so that directions of magnetic fluxes thereof are the same.

In this configuration, as a result of the directions of the magnetic fluxes of the first, second, and third inductors being the same, the magnetic flux density is reduced by the magnetic fluxes canceling each other out and the risk of inductances of the first, second, and third inductors being affected by the magnetic fluxes is minimized. Furthermore, by making the directions of the magnetic fluxes be the same, changing of the inductances due to coupling between the inductors is prevented.

According to various preferred embodiments of the present invention, even when a misalignment occurs, the effect on the filter characteristics of the filter circuit is prevented or minimized since the inductances of the first inductor, the second inductor, and the third inductor each change by the same or substantially the same proportion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of a filter circuit according to the present invention will be described which reference to the drawings. In the preferred embodiments to be described below, the filter circuit according to a preferred embodiment of the present invention will be described as a bandpass filter (hereafter, BPF) having band pass characteristics.

Figure 1:
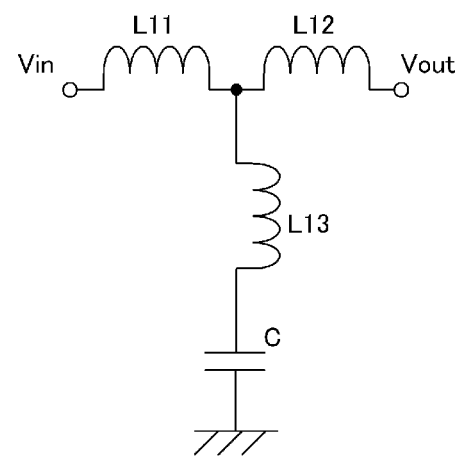
FIG. 1 is a circuit diagram illustrating a filter circuit described in Japanese Unexamined Patent Application Publication No. 2007-129565.
Figure 2:
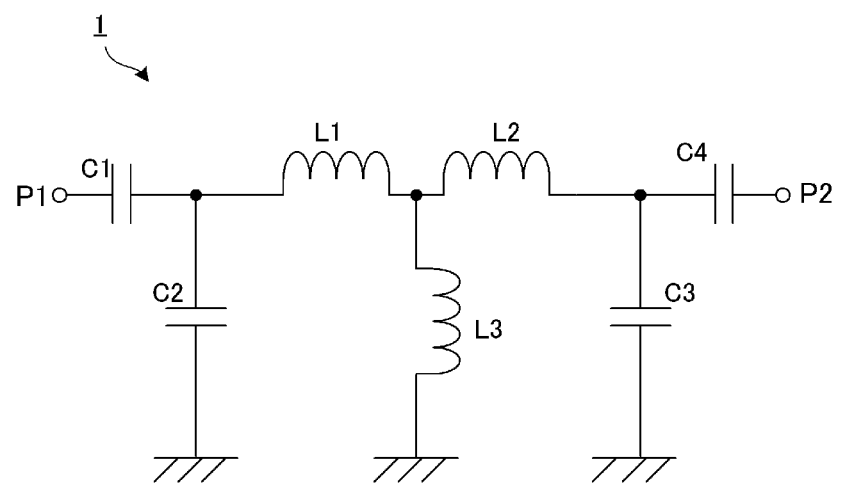
FIG. 2 is a circuit diagram that schematically illustrates a bandpass filter according to a preferred embodiment of the present invention.

FIG. 2 illustrates a schematic equivalent circuit of a BPF according to a preferred embodiment of the present invention. A BPF 1 according to the present preferred embodiment preferably includes a multilayer body including a plurality of dielectric layers stacked on top of one another, and electrode patterns (conductive patterns) provided on the dielectric layers. Input/output terminals, a ground potential, inductors, capacitors, signal lines and other suitable circuit elements, for example, which will be described below, are preferably defined by the electrode patterns.

The BPF 1 preferably includes an input terminal P1 and an output terminal P2, to and from which high-frequency signals are input and output. A capacitor C1, an inductor L1 (first inductor), an inductor L2 (second inductor) and a capacitor C4 are connected in series with each other along a signal line that is connected between the input terminal P1 and the output terminal P2.

A connection point between the capacitor C1 and the inductor L1 is connected to the ground potential via a capacitor C2. A connection point between the inductor L1 and the inductor L2 is connected to the ground potential via an inductor L3 (third inductor). In addition, a connection point between the inductor L2 and the capacitor C4 is connected to the ground potential via a capacitor C3.

The capacitances of the capacitors C1, C2, C3 and C4 and the inductances of the inductors L1, L2 and L3 are preferably set so that the BPF 1 allow signals of a desired frequency band to pass therethrough.

Figure 3:
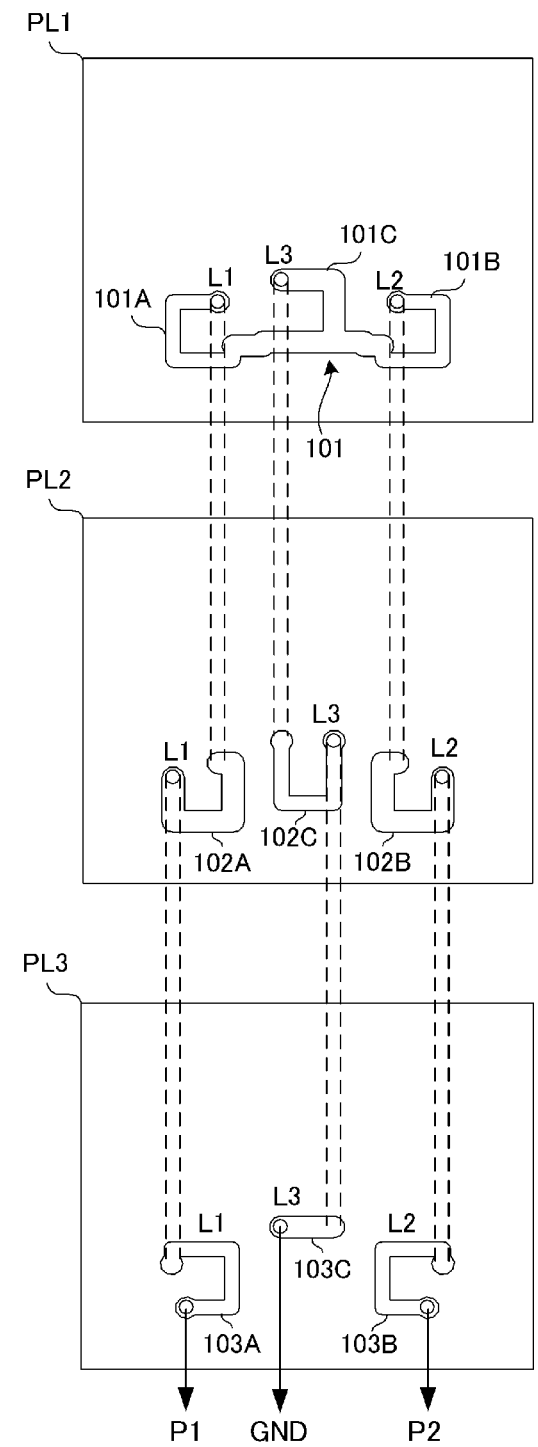
FIG. 3 illustrates dielectric layers of a multilayer body of a bandpass filter according to a preferred embodiment of the present invention.

FIG. 3 illustrates dielectric layers of a multilayer body of the BPF 1. In FIG. 3, only electrode patterns that define the inductors L1, L2 and L3 of FIG. 2 are illustrated and electrode patterns that define other elements, such as the capacitors illustrated in FIG. 2 and other dielectric layers and so forth are omitted. In addition, the circuit including the inductors L1, L2 and L3 is called a T circuit.

A substantially line-shaped electrode pattern 101 is arranged so as to extend in one direction (horizontal direction in FIG. 3) on one dielectric layer PL1 of the multilayer body. The two ends of this line-shaped electrode pattern 101 have a shape in which they are substantially bent at right angles relative to the rest of the line-shaped electrode pattern 101 and are then further substantially bent at right angles toward the inside. Electrode patterns 101A and 101B having these bent shapes define portions of the inductors L1 and L2, respectively. In addition, an electrode pattern 101C, which has a similar shape to the electrode pattern 101B is provided at substantially the center of the line-shaped electrode pattern 101. The electrode pattern 101C defines a portion of the inductor L3.

The dielectric layer PL1 may be a surface layer or may be a central layer of the multilayer body of the BPF 1.

Substantially open-loop-shaped electrode patterns 102A, 102B and 102C, which define portions of the inductors L1, L2 and L3, respectively, are provided on a dielectric layer PL2, which is adjacent to the dielectric layer PL1. The electrode pattern 102A and the electrode pattern 102B have shapes that are substantially line symmetrical with each other. In addition, electrode patterns 103A, 103B and 103C, which define portions of the inductors L1, L2 and L3, respectively, are provided on the dielectric layer PL3, which is adjacent to the dielectric layer PL2. The electrode patterns 103A and 103B have shapes that are substantially line symmetrical with each other. Furthermore, the electrode pattern 103A is connected to the input terminal P1, the electrode pattern 103B is connected to the output terminal P2 and the electrode pattern 103C is connected to a ground potential GND.

The electrode patterns 101A, 102A, and 103A are in conductive contact with one another through via hole conductors, are superposed with one another in the stacking direction, and define the inductor L1. The electrode patterns 101C, 102C, and 103C are in conductive contact with one another through via hole conductors, are superposed with one another in the stacking direction and define the inductor L3. The electrode patterns 101B, 102B, and 103B are in conductive contact with one another through via hole conductors, are superposed with one another in the stacking direction and define the inductor L2. Here, when viewed from the dielectric layer PL3 side, the inductor L1 has a substantially spiral shape that extends from the dielectric layer PL1 to the dielectric layer PL3 while looping in the anticlockwise direction, and the inductors L2 and L3 have substantially spiral shapes that extend from the dielectric layer PL1 to the dielectric layer PL3 while looping in the clockwise direction.

In the inductors L1, L2, and L3, when a high-frequency signal is input from the input terminal P1, the directions of magnetic fluxes generated by the inductors L1, L2, and L3 are the same. Since the inductors L1, L2, and L3 are arranged in the vicinity of one another, the directions of magnetic fluxes thereof are the same, and therefore, changes in inductance that occur are prevented or minimized due to the magnetic fluxes of the inductors L1, L2 and L3 canceling each other out and the magnetic flux density becoming small. In addition, since the directions of the magnetic fluxes are the same, changes in inductance due to electromagnetic coupling are prevented or minimized.

Furthermore, the electrode patterns 101A, 102A, and 103A and the electrode patterns 101B, 102B, and 103B provided on the dielectric layers PL1, PL2, and PL3 are configured so as to have the same or substantially the same pattern width and the same or substantially the same pattern length. More specifically, the electrode pattern 101A and the electrode pattern 101B preferably have substantially open loop shapes that have line symmetry with each other and preferably have the same or substantially the same pattern width and the same or substantially the same loop diameter. Similarly, the electrode pattern 102A and the electrode pattern 102B, and the electrode pattern 103A and the electrode pattern 103B preferably respectively have substantially open loop shapes that have line symmetry with each other and preferably have the same or substantially the same pattern width and the same or substantially the same loop diameter.

Furthermore, since the electrode patterns of the inductors L1, L2, and L3 are provided on the same dielectric layers PL1, PL2, and PL3, even when a misalignment occurs between the dielectric layers PL1, PL2, and PL3, the inductances of the inductors L1, L2, and L3 are each changed by the same or substantially the same proportion.

On the other hand, for example, when the inductor L1 is provided on the dielectric layers PL1, PL2, and PL3 and the inductors L2 and L3 are provided on dielectric layers other than the dielectric layers PL1, PL2, and PL3, if a misalignment occurs only between the dielectric layers PL1, PL2, and PL3, only the inductance of the inductor L1 is changed and the inductances of the inductors L2 and L3 are not changed. That is, the ratio between the inductances of the inductors L1, L2, and L3 is changed and there is a large change in filter characteristics.

Therefore, by making the inductances of the inductors L1, L2, and L3 of the T circuit be changed by substantially the same proportion, the effect of this change on the filter characteristics of the BPF 1 is small. Hereafter, the relationship between misalignment and filter characteristics of the BPF 1 will be described.

Figure 4A:
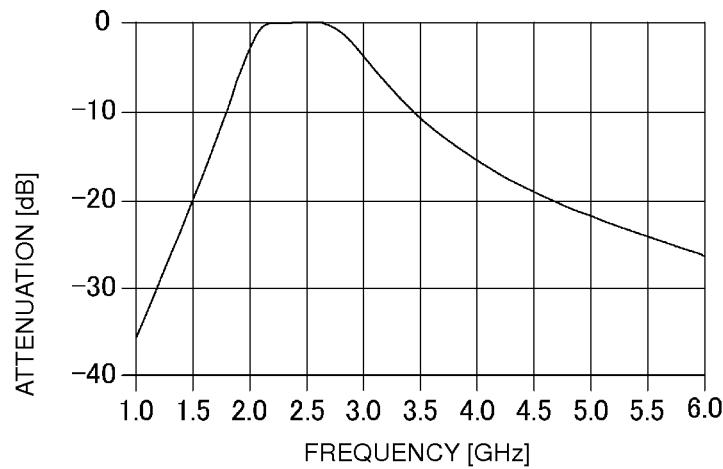
FIGS. 4A to 4C illustrate examples of frequency characteristics of the bandpass filter according to a preferred embodiment of the present invention.
Figure 4B:
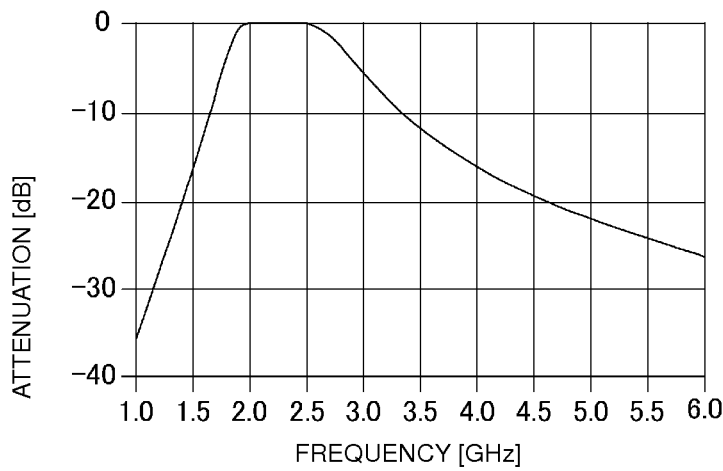
Figure 4C:
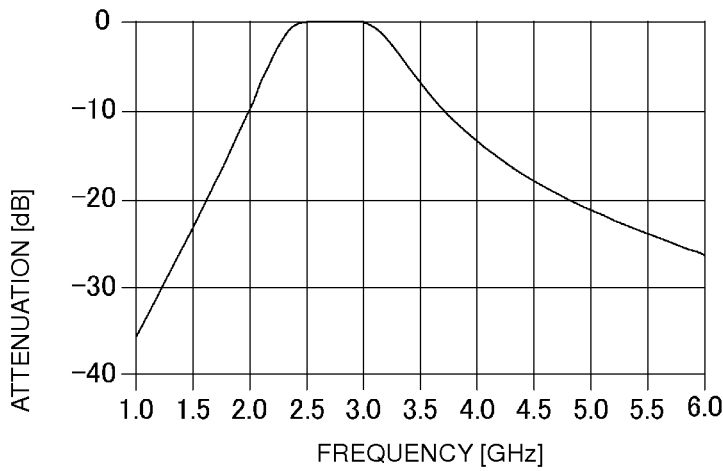

FIGS. 4A to 4C illustrate examples of frequency characteristics of the BPF 1 according to the present preferred embodiment. FIG. 4A illustrates the frequency characteristics in a case where there is no misalignment, FIG. 4B illustrates the frequency characteristics in a case where a misalignment has occurred and the inductances of the inductors L1, L2, and L3 are approximately 20% greater than those in the case of no misalignment, and FIG. 4C illustrates the frequency characteristics in a case where a misalignment has occurred and the inductances of the inductors L1, L2, and L3 are approximately 20% less than those in a case of no misalignment.

Figure 5:
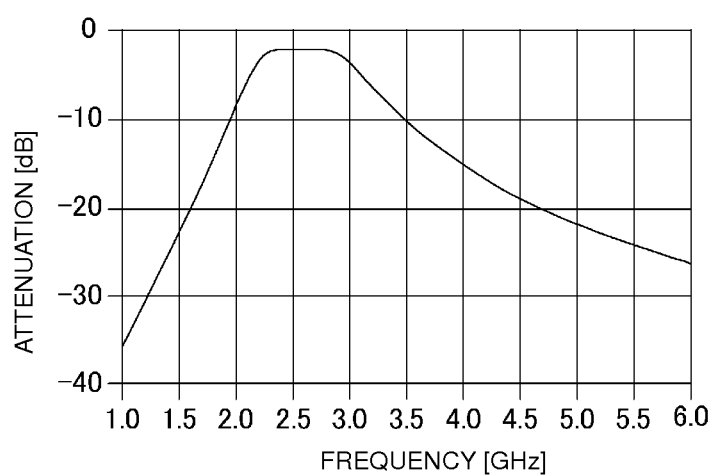
FIG. 5 is a diagram for comparison with FIGS. 4A to 4C and illustrates an example of the frequency characteristics of a bandpass in which inductors are provided on different dielectric layers.

Furthermore, FIG. 5 is a diagram for comparison with FIGS. 4A to 4C and illustrates an example of the frequency characteristics of a BPF in which the inductors L1, L2, and L3 are respectively provided on different layers. In the case of the BPF of FIG. 5, the inductor L1 is provided on the dielectric layers PL1, PL2, and PL3 and the inductors L2 and L3 are provided on different dielectric layers to the dielectric layers PL1, PL2 and PL3. In FIG. 5, frequency characteristics are illustrated for a case in which the inductance of the inductor L1 is about 20% greater and the inductances of the inductors L2 and L3 are about 20% less. In FIGS. 4A to 4C and FIG. 5, it is assumed that changes in the capacitances of the capacitors C1, C2, C3, and C4 illustrated in FIG. 2 due to a misalignment are not considered.

In FIGS. 4A to 4C and FIG. 5, frequency characteristics (frequency attenuation characteristics) of the level of a signal output from the output terminal P2 relative to the level of a signal input from the input terminal P1 are illustrated. Comparing FIG. 4B and FIG. 4C with FIG. 4A, even though the central frequency of the pass band is changed, the waveform of the frequency attenuation characteristics maintains the same or substantially the same shape. That is, in the case of the BPF 1 of this preferred embodiment, even when a misalignment occurs, the attenuation level inside and outside the band is maintained and the effect on the frequency attenuation characteristics of the BPF 1 is small. This is due to the fact that the inductances of the inductors L1, L2, and L3 are each changed by the same proportion and the balance between the inductances is maintained.

In contrast, comparing FIG. 5 with FIGS. 4A to 4C, the shape of the waveform of the frequency attenuation characteristics is markedly different. In particular, the attenuation level within the pass band is increased. This is because the inductances of the inductors L1, L2, and L3 are changed by different proportions when the inductors L1, L2, and L3 are provided on different dielectric layers, and even when the changes in the values of the inductances are the same or substantially the same, the frequency characteristics of the BPF are markedly affected.

The specific configuration of the filter circuit according to preferred embodiments of the present invention can be appropriately designed and modified. The operation and advantageous effects detailed in the above-described preferred embodiment are simply provided as an example of preferred embodiments of the present invention. The operation and advantageous effects of the present invention are not limited to those detailed in the above-described preferred embodiment.

For example, in the above-described preferred embodiment, a description of a BPF was provided as an example, but the filter circuit according to preferred embodiments of the present invention may be a low pass filter or a high pass filter, for example. In addition, the inductors L1, L2, and L3 of the T circuit described above are preferably provided on three dielectric layers PL1, PL2 and PL3, but may preferably instead be provided on two or more than three dielectric layers.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A filter circuit comprising:
   a multilayer body including a plurality of dielectric layers stacked on top of one another in a stacking direction;
   a first inductor including first conductive patterns provided on the plurality of dielectric layers and arranged so as to be superposed with one another in the stacking direction;
   a second inductor including second conductive patterns provided on the plurality of dielectric layers and arranged so as to be superposed with one another in the stacking direction; and
   a third inductor including third conductive patterns provided on the plurality of dielectric layers and arranged so as to be superposed with one another in the stacking direction; wherein
   the first inductor is connected in series with the second inductor;
   a first end of the third inductor is connected to a connection point between the first inductor and the second inductor, and a second end of the third inductor is directly connected to a ground potential;
   the first conductive patterns, the second conductive patterns and the third conductive patterns are respectively provided on the same plurality of dielectric layers.

2. The filter circuit according to claim 1, wherein the first conductive patterns and the second conductive patterns have substantially the same shape and substantially the same pattern width.

3. The filter circuit according to claim 1, wherein the first inductor, the second inductor, and the third inductor are arranged so that directions of magnetic fluxes thereof are the same.

4. The filter circuit according to claim 2, wherein the first inductor, the second inductor, and the third inductor are arranged so that directions of magnetic fluxes thereof are the same.

* * * * *